(12) United States Patent
Kim

(10) Patent No.: US 6,359,826 B1
(45) Date of Patent: Mar. 19, 2002

(54) METHOD AND A SYSTEM FOR CONTROLLING A DATA SENSE AMPLIFIER FOR A MEMORY CHIP

(75) Inventor: Ju-Han Kim, Cupertino, CA (US)

(73) Assignee: Silicon Access Technology, Inc., San Jose, CA (US)

( * ) Notice: Subject to any disclaimer, the term of this patent is extended or adjusted under 35 U.S.C. 154(b) by 0 days.

(21) Appl. No.: 09/718,052

(22) Filed: Nov. 20, 2000

(51) Int. Cl.[7] .................................................. G11C 8/00
(52) U.S. Cl. ...................... 365/230.03; 365/63; 365/191
(58) Field of Search ........................... 365/230.03, 205, 365/207, 208, 191, 63

(56) References Cited

U.S. PATENT DOCUMENTS

| | | | | |
|---|---|---|---|---|
| 5,331,595 A | * | 7/1994 | Inoue | 365/203 |
| 5,355,342 A | * | 10/1994 | Ueoka | 365/201 |
| 6,119,249 A | * | 9/2000 | Landry | 714/718 |

* cited by examiner

*Primary Examiner*—Son Mai
(74) *Attorney, Agent, or Firm*—Fernandez & Associates LLP

(57) ABSTRACT

A memory chip having a system for controlling sensing time of a data sense amplifier (DSA). A global control is adapted for initiating data access to the memory blocks. A wire path coupling the global control to each memory block is utilized by each memory block as a part of transmitting path for receiving a block enable signal sent from the global control. Specifically, a memory block includes a wired-NOR circuit adapted to send a DSA enable signal to the DSA in response to being selected by a block enable signal. In contrast to a simple delay circuit that only controls the DSA roughly, this wired-NOR circuit tracks internal read signal, and controls the DSA tightly. The time from the activation of the block enable signal by the global control to the enabling of the DSA stays approximately the same irrespective of the memory block's location in the memory chip. Block location independence of DSA sensing time allows tighter memory cycle.

14 Claims, 2 Drawing Sheets

METHOD AND A SYSTEM FOR CONTROLLING A DATA SENSE AMPLIFIER FOR A MEMORY CHIP

FIELD OF THE INVENTION

The invention relates to controlling a sense amplifier, particularly to controlling sense timing of a data sense amplifier (DSA) for a memory chip.

BACKGROUND

Fast random cycle is required in a high-density memory, particularly in a dynamic random access memory (DRAM). The main bottleneck of the random cycle is the coordination between the enable timing to a memory block and the enable timing to a global DSA. Specifically, for stable DSA operation, the DSA is enabled after the arrival of data from an enabled memory block. However, from a global control that initiates data accesses and DSA enables, enabling a far memory block takes longer time than enabling a near memory block. As such, in order to ensure that the global DSA is enabled after the arrival of read data at the DSA, delay is added to the transmission of a DSA enable signal. Delaying DSA enabling time is critical for stable DSA operation, and is typically controlled by either a simple inverter delay circuit or a routing delay circulating a part of the memory chip. As such, memory cycle time is limited by DSA enabling time because enabling block and DSA need longer timing margin to accommodate the worst case scenario of enabling both the DSA and a memory block farthest from the global control.

Thus, a need exists for a DSA sensing timing control that offers the same timing characteristics whether the data is from the far block or from the near block.

SUMMARY

The invention provides a DSA sensing timing control that offers the same timing characteristics whether the data is from the far block or from the near block.

Preferably, within a memory chip having a plurality of memory blocks, a system for controlling sensing time of a DSA comprises a global control, and a common wire path shared by all memory blocks. The global control is adapted for initiating data access to the memory blocks. The common wire path couples the global control to each memory block. The wire path is utilized by each memory block as a part of transmitting path for receiving a block enable signal sent from the global control. Moreover, each memory block is adapted to send out a DSA enable signal to the DSA in response to being selected by a block enable signal. The time from the activation of the block enable signal by the global control to the enabling of the DSA stays approximately the same irrespective of the selected memory block's location in the memory chip.

Additionally, each memory block includes a wired-NOR circuit adapted to send out the DSA enable signal in response to the memory block receiving a block enable signal. In contrast to a simple delay circuit that only controls the DSA roughly, this wired-NOR circuit tracks internal read signal, and controls the DSA tightly. Without A driver circuit is provided for adding a delay to the propagation of the DSA enable signal from the memory block. Regardless of the enabled memory block's location in the memory chip, the DSA is enabled after arrival of read data coming from the enabled memory block.

These and other objects and advantages of the present invention will no doubt become obvious to those of ordinary skill in the art after having read the following detailed description of the preferred embodiments which are illustrated in the various drawing figures.

BRIEF DESCRIPTION

The accompanying drawings which are incorporated in and form a part of this specification, illustrate embodiments of the invention and together with the description, serve to explain the principles of the invention:

DETAILED DESCRIPTION

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
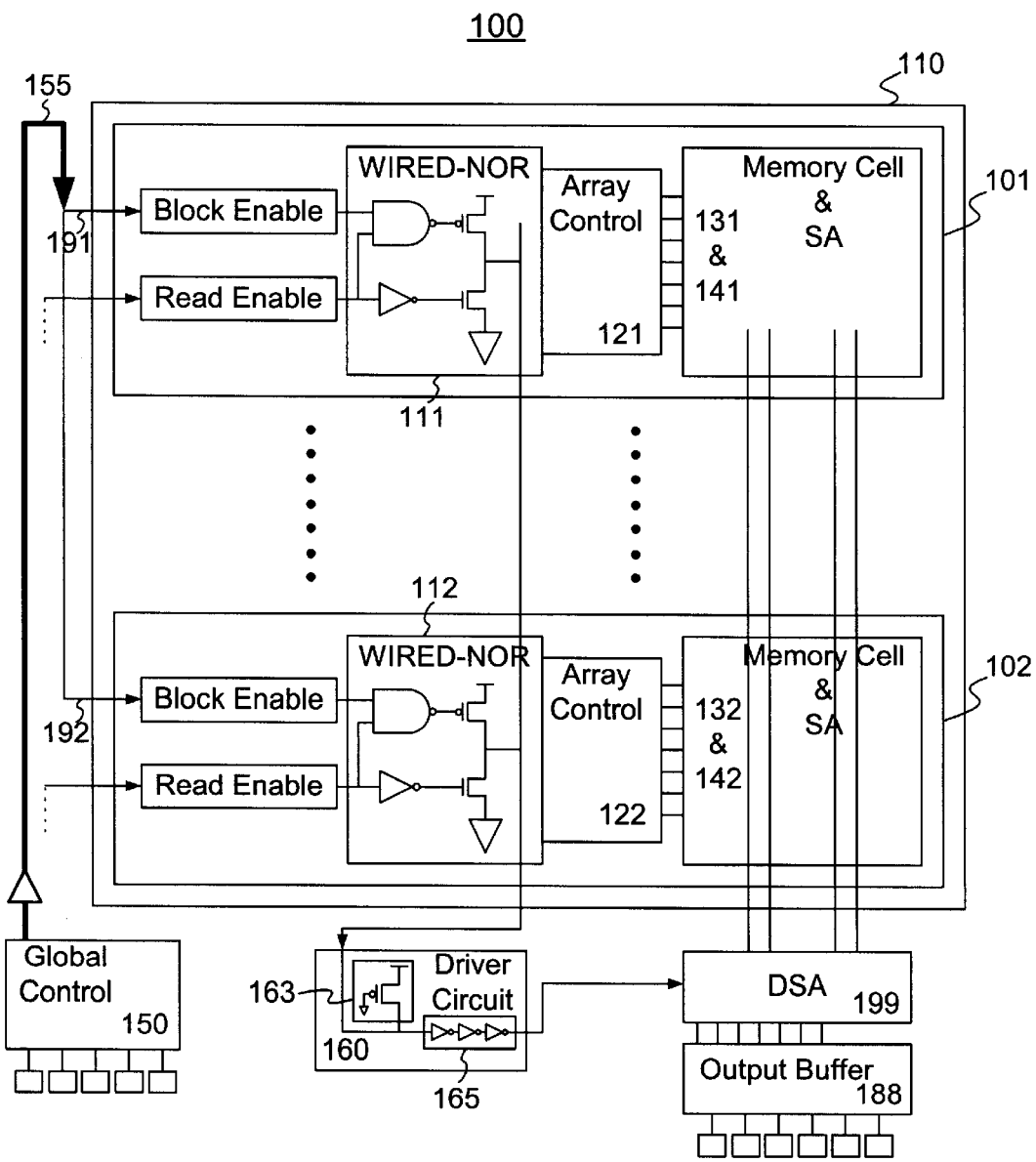
FIG. 1 shows a memory chip system in accordance with one embodiment of the invention.

Referring now to FIG. 1, a memory chip 100 is shown containing components for controlling sensing time of data sense amplifier (DSA) enable in accordance with one embodiment of the invention. FIG. 1 also shows a memory portion 110 of memory chip 100.

Referring still to FIG. 1, memory portion 110 of memory chip 100 comprises n memory blocks. But as a simplification, only top block 101 and bottom block 102 are shown in FIG. 1. Each block includes a wired-NOR circuit. This wired-NOR circuit is coupled to an array control that is in turn coupled to a memory cell and a sense amplifier (SA). The memory cell and SA are coupled to a DSA 199. DSA 199 is coupled to an output buffer 188 for data read out.

For example, top block 101 includes a wired-NOR circuit 111; wired-NOR circuit 111 is coupled to an array control 121 that is in turn coupled to a memory cell 131 and a SA 141. Memory cell 131 and SA 141 are coupled to DSA 199. When top block 101 is enabled, data stored in memory cell 131 is transmitted to DSA 199. Similarly, bottom block 102 includes a wired-NOR circuit 112; wired-NOR circuit 112 is coupled to an array control 122 that is in turn coupled to a memory cell 132 and a SA 142. Memory cell 132 and SA 142 are coupled to DSA 199. When bottom block 102 is enabled, data stored in memory cell 132 is transmitted to DSA 199.

Besides memory portion 110 of memory chip 100, memory chip 100 also includes components for controlling sensing time of a DSA enable signal. These components comprise a global control 150 coupled to memory blocks (e.g. top block 101 and bottom block 102) in memory portion 110, a driver circuit 160, and various wires. Furthermore, wire-NOR circuits (e.g., 111–112) also play a part in controlling sensing time of a DSA enable signal.

Global control 150 is coupled to every block within memory portion 110 and initiates various operations (signal flows) of memory chip 100. Specifically, global control 150 is adapted to send a block enable signal for selecting a memory block within memory portion 110. Also, global control 150 can send an address signal and a read enable signal to each memory block. When a memory block is selected by a block enable signal from global control 150, the selected block's associated wired-NOR is triggered to send a DSA enable signal to DSA 199. On the way to DSA 199, this DSA enable signal passes through driver circuit 160 that delays this DSA enable signal.

For example, when top block 101 is selected by block enable signal from global control 150, wired-NOR 111 is triggered to send a DSA enable signal through driver circuit 160 to DSA 199. Similarly, when bottom block 102 is selected by block enable signal from global control 150, wired-NOR 112 is triggered to send a DSA enable signal through driver circuit to DSA 199.

In contrast to prior art systems for enabling a DSA directly from a global control, DSA 199 in the present embodiment is not enabled directly from a global control such as global control 150, but is enabled indirectly by global control 150. That is, DSA 199 is enabled by a DSA enable signal sent from individual memory block selected by global control 150. Every memory block (specifically its wired-NOR circuit) within memory portion 110, once selected by a block enable signal from global control 150, individually sends out a DSA enable signal to DSA 199.

Also in contrast to prior art systems for enabling a DSA, no matter which block is selected, block enable signal initially travels through a common wire path 155 that is shared by all blocks as indicated in FIG. 1. Before circulating to any other memory block, common wire path 155 first reach top block 101, which is located farthest from global control 150 than any other block within memory portion 110. As such, even though bottom block 102 is closer to global control 150 than top block 101, a block enable signal intended for bottom block 102 must first travels through common wire path 155 that first reaches top block 101. That is, irrespective of a memory block's location within memory portion 110, this memory block is selected by a block enable signal that initially travels through common wire path 155.

Implementing this common wire path turns out to have advantageous consequences that improve memory performance. For example, the length of time taken by global control 150 to enable DSA 199 indirectly through any memory block is made consistently the same.

Thus, as a consequence of blocks sharing common wire path 155, even though bottom block 102 is closer to global control 150 (than top block 101 is to global control 150), the time for enabling (selecting) bottom block 102 is greater than the time for enabling top block 101. But because bottom block 102 is closer to DSA 199 (than top block 101 is to DSA 199), the time for triggering DSA 199 from bottom block 102 is less than the time for triggering DSA 199 from top block 101. Consequently, the total time taken for global control to indirectly enable DSA 199 through selecting (enabling) bottom block 102 is approximately equal to the total time for global control 150 to indirectly enable DSA 199 through selecting (enabling) top block 101. By the similar argument, the total time taken for global control to indirectly enable DSA 199 through selecting (enabling) a block is approximately equal to the total time for global control 150 to indirectly enable DSA 199 through selecting (enabling) any other memory block. Advantageously, sensing time of DSA 199 is made consistently the same, irrespective an enabled block's location on memory chip 100. Wired-NOR circuit controls DSA 199 tightly and improves memory access cycle time.

Thus, this indirect triggering of DSA 199 by global control 150 has advantageous consequences that can be gleaned by comparing two time intervals. The first time interval quantifies the total time required for global control 150 to indirectly trigger DSA 199 when top block 101 is selected global control 150. The second time interval quantifies the total time required for global control 150 to indirectly trigger DSA 199 when bottom block 102 is selected by global control 150. Even though the distance from top block 101 to global control 150 is greater than the distance from bottom block 102 to global control 150, this difference in distances is compensated. Specifically, the distance from top block 101 to DSA 199 through driver circuit 160 is longer than the distance from bottom block 102 to DSA 199 through driver circuit 160. Thus, the first and second time intervals described above are approximately the same. In other words, sensing time of DSA 199 is made block location independent.

In one embodiment, driver 160 comprises a static pull-up 163 and a delay chain 165. Specifically, static pull-up sustains high level at standby mode. In addition to providing delay, delay chain 165 allows precise calibration of timing margin to start DSA 199. As such, driver 160 also allows timing margin to be controlled tightly, thereby reducing cycle time.

The main bottleneck encountered in prior art systems for controlling sensing time of a DSA is thus removed in the present embodiment. Specifically, due to block dependency in time used for enabling a DSA, prior art systems sacrifice performance (e.g., using longer cycle time) in order to ensure that a DSA is enabled after the arrival of read data from a memory block. In contrast, because the time used for enabling DSA 199 indirectly from global control 150 remains approximately the same irrespective of which block is selected for data read-out, ensuring that DSA 199 is enabled after the arrival of read data from the selected block becomes straightforward. That is, because sensing time of DSA 199 is block location independent, a fixed amount of delay can be added (by driver circuit 160) to a DSA enable signal from a selected block en route to DSA 199, irrespective of the location of the selected block in memory portion 110.

In summary, memory performance bottleneck in prior art approaches is avoided because the sense timing of DSA 199 does not depend on the location of a block being selected. As such, within a clock cycle, no matter which block (e.g., whether top block 101 or bottom block 102) is selected from memory portion 110, DSA 199 is enabled consistently with approximately same amount of time. As such, a fixed amount of delay is added to a DSA enable signal by driver circuit 160 to ensure that DSA 199 is enabled after the arrival of read data at DSA 199. Advantageously, memory performance is improved because this consistent (i.e., independent of block location) timing of DSA enable signal reduces timing error, and thus allowing tighter clock cycles. Thus, in contrast to the prior art memory chip system, in the present embodiment, a DSA enable signal (coming from an enabling block) does not depend on that block's distance from DSA 199. As such, DSA enable signal is a self-timed signal that allows DSA 199 to be controlled tightly.

Figure 2:
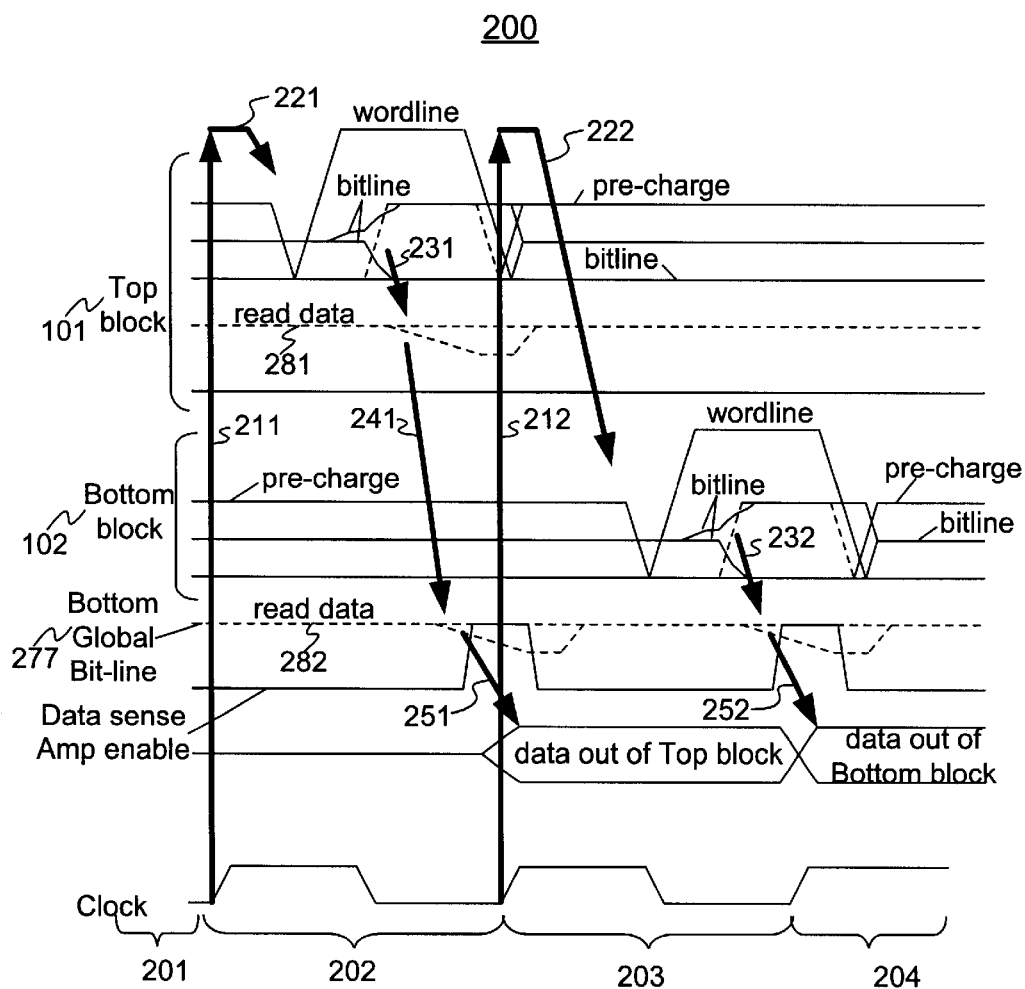
FIG. 2 shows a timing diagram for a memory chip system operating in accordance with one embodiment of the invention.

Referring now to FIG. 2 in view of FIG. 1, a timing diagram 200 of several clock cycles 201–204 is shown for memory chip 100 operating in accordance with one embodiment of the invention. As a simplification, only the timing of top block 101 and bottom block 102 are considered.

The length of arrow 211 symbolizes the distance traveled by a block enable signal 191 for enabling top block 101 in clock cycle 202. The length of arrow 212 symbolizes the distance traveled by a block enable signal 192 for enabling bottom block 102 in clock cycle 203. Arrow 211–212 are of the same length because both block enable signals 191–192 travel through common wire path 155, regardless of their respective destination blocks 101–102.

Arrow 221 symbolizes the distance (after common wire path 155) traveled by block enable signal 191 to enable top block 101. Arrows 231 and 241 symbolize the distance traveled by read data 281 from top block 101 to bottom global bit line 277. Arrow 251 symbolizes read data 281 being read out of DSA 199 when DSA 199 is enabled towards the end of clock cycle 202.

Arrow 222 symbolizes the distance (after common wire path 155) traveled by block enable signal 192 to enable bottom block 102. Arrow 232 symbolizes the distance traveled by read data 282 from bottom block 102 to bottom global bit line 277. Arrow 252 symbolizes read data 282 being read out of DSA 199 when DSA 199 is enabled towards the end of clock cycle 203.

As shown in FIG. 2, these arrows taken together illustrate block location independence for sensing time of DSA 199. Specifically, the total distance resulting from adding distances of arrows 211, 221, 231, 241 and 251 is approximately equal to the total distance resulting from adding distances of arrows 212, 222, 232, and 252.

Consequently, as previously explained, sensing time of DSA is made into approximately the same length irrespective of block location of a read out data. Thus, consistent margin for enabling DSA 199 is achieved within each clock cycle, as is shown in FIG. 2. The consistency of margin allows cycle time to be reduced to improve memory performance. Advantageously, even as cycle time shrinks, memory operation will remain robust. In contrast, in prior art memory chip systems, a DSA enable signal is given either no margin or too much margin. As such, when the cycle time is reduced in prior art memory chip systems, the operation is not robust.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A method for controlling sensing time of a data sense amplifier (DSA) for a memory chip, said method comprising the steps:
   a) irrespective of a memory block's location in said memory chip, selecting said memory block by sending a block enable signal through a wire path shared by all memory blocks of said memory chip; and
   b) upon said memory block being selected, triggering said DSA by sending a DSA enable signal from said memory block to said DSA, wherein sensing time of said DSA is approximately the same irrespective of said memory block's location in said memory chip.

2. The method of claim 1, wherein said step b) further comprising the step of:
   passing said DSA enable signal through a driver circuit to add a fixed amount of delay to said DSA enable signal, said fixed amount of delay ensuring that read data from said selected memory block arrive before said DSA is enabled.

3. The method of claim 1, wherein in said step b), said DSA enable signal is generated by a wired-NOR circuit associated with said memory block when said wired-NOR is triggered by said block enable signal.

4. A memory block among a plurality of memory blocks in a memory chip said memory block comprising:
   a block enable circuit coupled to a global control via a wire path that contains an initial segment shared by said plurality of memory blocks, said block enable circuit adapted to enable said memory block in response to a block enable signal received from said global control via said wire path; and
   a wired-NOR circuit adapted to send out a data sense amplifier (DSA) enable signal for enabling a DSA coupled to a memory cell of said memory block in response to said block enable circuit receiving said block enable signal.

5. The memory block of claim 4, wherein said block enable signal takes a first time interval to be transmitted from said global control to said block enable circuit via said wire path, wherein said DSA enable signal takes a second time interval to be transmitter from said wired-NOR circuit to said DSA, and wherein said first and second time intervals sum to a DSA sensing time, said DSA sensing time remains approximately the same length irrespective the location of said memory block in said memory chip.

6. The memory block of claim 4, wherein said wired-NOR circuit is coupled to said DSA through a driver circuit adapted to add a delay in transmitting said DSA enable signal to said DSA.

7. The memory block of claim 4, wherein regardless of said memory block's location in said memory chip, said DSA is enabled after arrival of read data coming from said memory block.

8. Within a memory chip having a plurality of memory blocks, a system for controlling sensing time of a data sense amplifier (DSA), said system comprising:
   a global control adapted for initiating data access to said memory blocks;
   a wire path coupling said global control to each memory block, said wire path utilized by each memory block as a part of transmitting path for receiving a block enable signal sent from said global control; and
   a memory block adapted to send out a DSA enable signal to said DSA in response to being selected by said block enable signal, wherein the time from the activation of said block enable signal by said global control to the enabling of said DSA stays approximately the same irrespective of said memory block's location in said memory chip.

9. The system of claim 8, wherein said memory block includes a wired-NOR circuit adapted to send out said DSA enable signal in response to said memory receiving said block enable signal.

10. The system of claim 8, further comprising a driver circuit for adding a delay to the propagation of said DSA enable signal from said memory block.

11. The system of claim 8, wherein regardless of said memory block's location in said memory chip, said DSA is enabled after arrival of read data coming from said memory block.

12. A memory system, comprising:
- a global control adapted for initiating block enable;
- a data sense amplifier (DSA) coupled to said global control;
- a first memory block coupled to said global control via a first wire path containing an initial wire segment that reaches a memory block located farthest away from said global control and said DSA, said first memory block adapted to enable said DSA by sending a first DSA enable signal in response to receiving a first block enable from said global control; and
- a second memory block coupled to said global control via a second wire path also containing said initial wire segment, said second memory block adapted to enable said DSA by sending a second DSA enable signal in response to receiving a second block enable from said global control;
- wherein a first sensing time of said DSA by said global control via said first memory block approximately equals to a second sensing time of said DSA by said global control via said second memory block.

13. A memory system, comprising:
- a global control adapted for initiating block enable;
- a data sense amplifier (DSA) coupled to said global control;
- a first memory block coupled to said global control via a first wire path containing an initial wire segment that reaches a memory block located farthest away from said global control and said DSA, said first memory block adapted to enable said DSA by sending a first DSA enable signal in response to receiving a first block enable from said global control;
- a second memory block coupled to said global control via a second wire path also containing said initial wire segment, said second memory block adapted to enable said DSA by sending a second DSA enable signal in response to receiving a second block enable from said global control; and
- a driver circuit for adding a delay to the propagation of said first DSA enable signal from said first memory block, said driver circuit also for adding said delay to the propagation of said second DSA enable signal from said second memory block.

14. A memory system, comprising:
- a global control adapted for initiating block enable;
- a data sense amplifier (DSA) coupled to said global control;
- a first memory block coupled to said global control via a first wire path containing an initial wire segment that reaches a memory block located farthest away from said global control and said DSA, said first memory block adapted to enable said DSA by sending a first DSA enable signal in response to receiving a first block enable from said global control; and
- a second memory block coupled to said global control via a second wire path also containing said initial wire segment, said second memory block adapted to enable said DSA by sending a second DSA enable signal in response to receiving a second block enable from said global control;
- wherein regardless of the location of said first memory block in said memory system, said DSA is enabled after arrival of read data coming from said first memory block, and wherein regardless of the location of said second memory block in said memory system, said DSA is enabled after arrival of read data coming from said second memory block.

* * * * *